(12) United States Patent
Ng et al.

(10) Patent No.: US 8,450,834 B2
(45) Date of Patent: May 28, 2013

(54) SPACER STRUCTURE OF A FIELD EFFECT TRANSISTOR WITH AN OXYGEN-CONTAINING LAYER BETWEEN TWO OXYGEN-SEALING LAYERS

(75) Inventors: Jin-Aun Ng, Hsinchu (TW); Bao-Ru Young, Zhubei (TW); Harry-Hak-Lay Chuang, Hsinchu (TW); Ryan Chia-Jen Chen, Chiayi (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 296 days.

(21) Appl. No.: 12/706,191

(22) Filed: Feb. 16, 2010

(65) Prior Publication Data

US 2011/0198675 A1   Aug. 18, 2011

(51) Int. Cl.
*H01L 21/8238* (2006.01)

(52) U.S. Cl.
USPC ........................................ 257/649

(58) Field of Classification Search
None
See application file for complete search history.

(56) References Cited

U.S. PATENT DOCUMENTS

| | | | |
|---|---|---|---|
| 2006/0205169 A1* | 9/2006 | Yoon et al. | 438/303 |
| 2006/0267106 A1* | 11/2006 | Chao et al. | 257/382 |
| 2008/0203486 A1* | 8/2008 | Wiatr et al. | 257/369 |
| 2008/0308882 A1* | 12/2008 | Carter et al. | 257/410 |
| 2009/0039433 A1* | 2/2009 | Yang et al. | 257/365 |
| 2009/0090941 A1* | 4/2009 | Tamura | 257/288 |
| 2010/0022061 A1* | 1/2010 | Wu et al. | 438/301 |
| 2010/0270627 A1* | 10/2010 | Chang et al. | 257/411 |

FOREIGN PATENT DOCUMENTS

| | | |
|---|---|---|
| CN | 1917150 | 2/2007 |
| CN | 101635277 | 1/2010 |

OTHER PUBLICATIONS

Office Action from corresponding application No. CN 201010241552.3.

* cited by examiner

*Primary Examiner* — Fernanado L Toledo
*Assistant Examiner* — Peter Bradford
(74) *Attorney, Agent, or Firm* — Lowe Hauptman Ham & Berner, LLP

(57) ABSTRACT

This disclosure relates to a spacer structure of a field effect transistor. An exemplary structure for a field effect transistor includes a substrate; a gate structure that has a sidewall overlying the substrate; a silicide region in the substrate on one side of the gate structure having an inner edge closest to the gate structure; a first oxygen-sealing layer adjoining the sidewall of the gate structure; an oxygen-containing layer adjoining the first oxygen-sealing layer on the sidewall and further including a portion extending over the substrate; and a second oxygen-sealing layer adjoining the oxygen-containing layer and extending over the portion of the oxygen-containing layer over the substrate, wherein an outer edge of the second oxygen-sealing layer is offset from the inner edge of the silicide region.

25 Claims, 11 Drawing Sheets

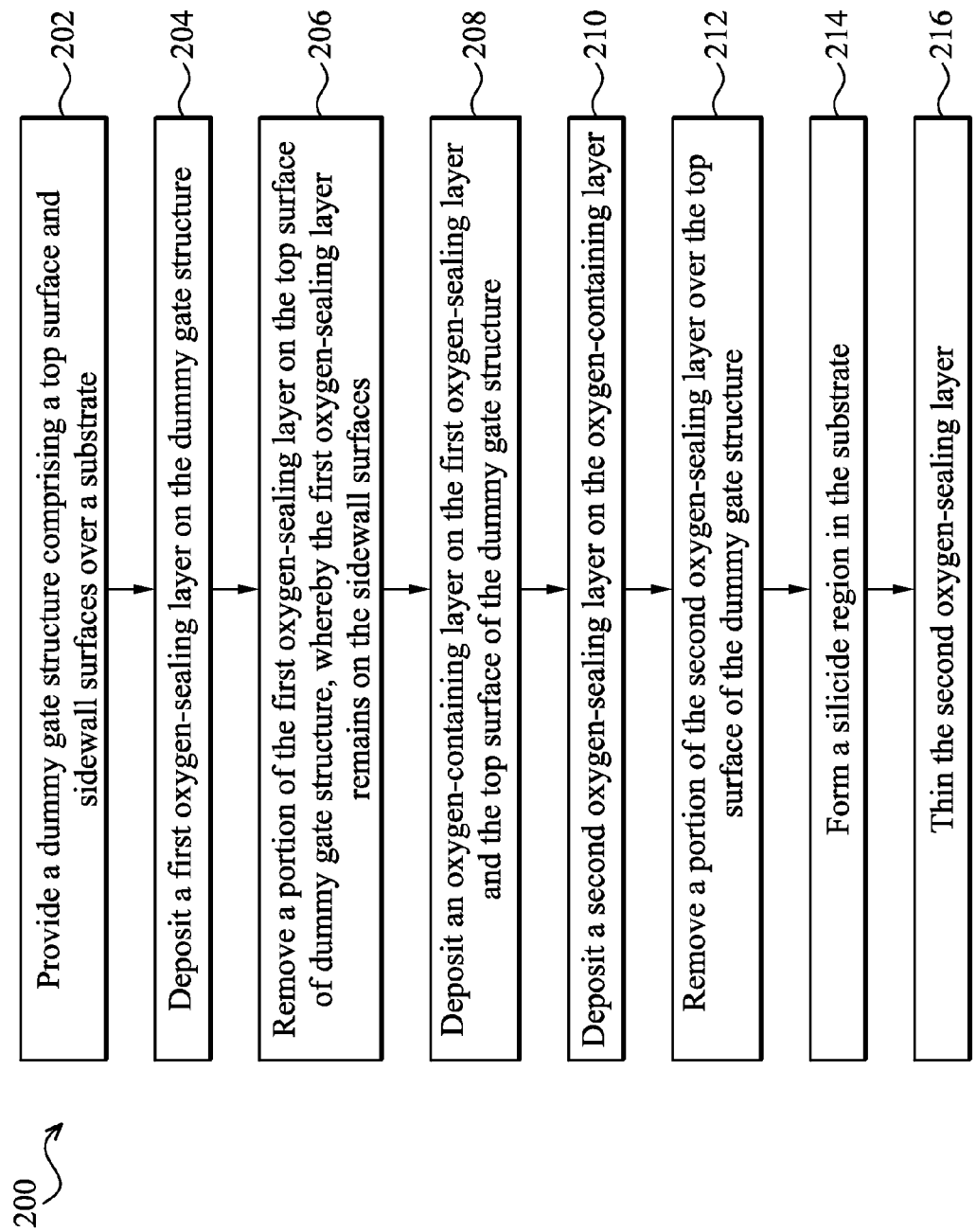

SPACER STRUCTURE OF A FIELD EFFECT TRANSISTOR WITH AN OXYGEN-CONTAINING LAYER BETWEEN TWO OXYGEN-SEALING LAYERS

TECHNICAL FIELD

The invention relates to integrated circuit fabrication, and more particularly to a field effect transistor with a spacer structure.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in CMOS fabrication. As the gate length and spacing between devices decrease, these problems are exacerbated. For example, in a "gate last" fabrication process, voids may be generated during deposition of an inter-layer dielectric (ILD) layer for gap filling.

FIG. 1 shows a cross-sectional view of a field effect transistor (FET) 100 fabricated by a "gate last" process with a conventional spacer structure 118. The FET 100 can be formed over an active region 103 of the substrate 102 adjacent to isolation regions 104. The FET 100 comprises lightly doped regions 122, source/drain regions 124, and silicide regions 126 formed in the active region 103 of the substrate 102, a gate structure 109 comprising a gate dielectric layer 106 and a dummy gate electrode 108 sequentially formed over the substrate 102, gate spacers 118 comprising sealing layers 112 and silicon oxide layers 116 respectively formed on both sidewalls of the gate structure 109. Additionally, a contact etch stop layer (CESL) 134 and an interlayer dielectric (ILD) layer 136 may also be formed over the substrate 102.

Due to the high aspect ratio of the opening between the gate spacers 118, a void 138 is often formed in the ILD layer 136. The void 138 is problematic in various respects. For example, any void 138 present in the ILD layer 136 can become a receptacle of metals during subsequent processing thereby increasing the likelihood of device instability and/or device failure.

Accordingly, what is needed is an improved device and method of spacer formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a flowchart illustrating a method for fabricating a spacer structure according to various aspects of the present disclosure;

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples of a "gate last" metal gate process, however, one skilled in the art may recognize applicability to other processes and/or use of other materials.

Figure 1:
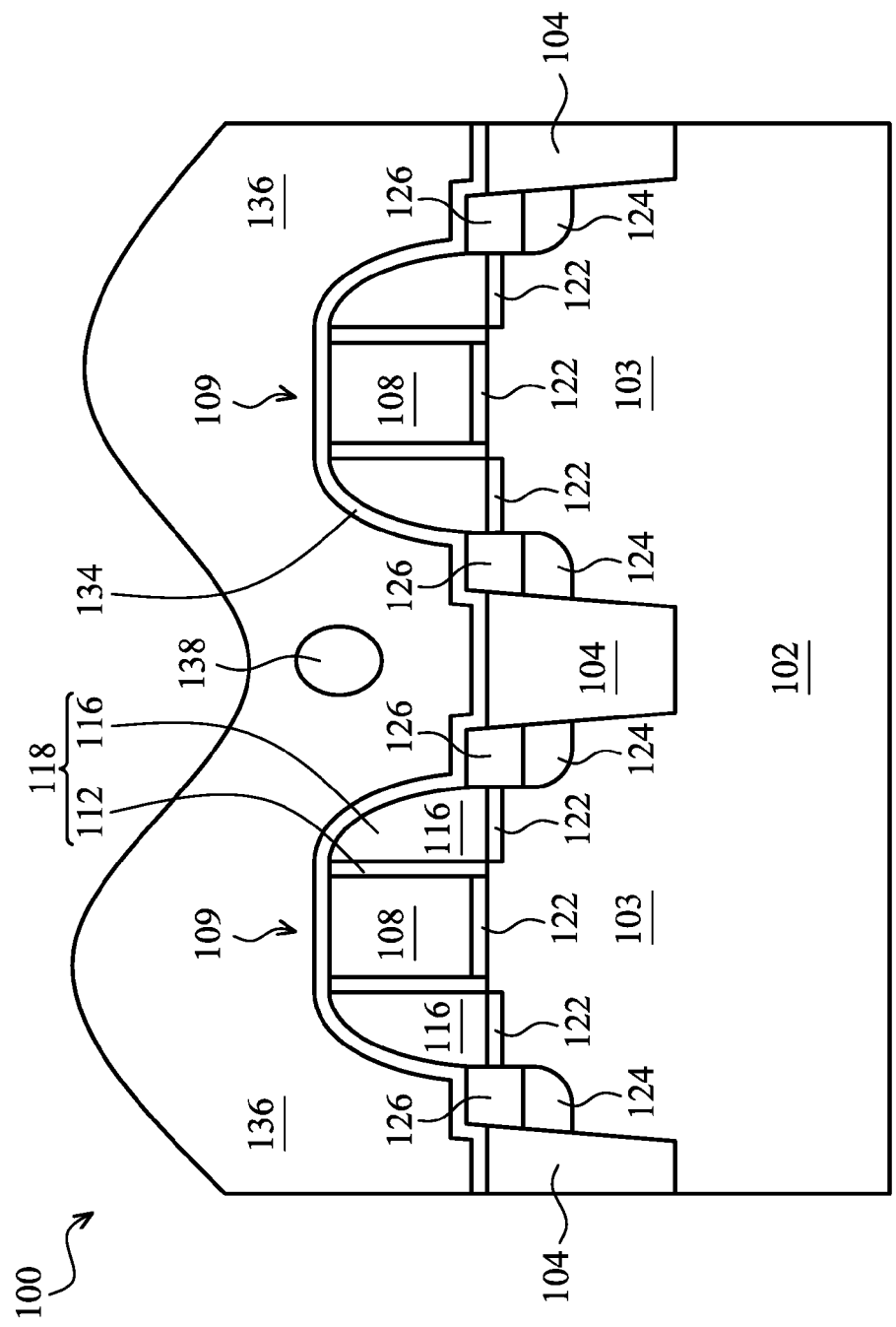
FIG. 1 shows a cross-sectional view of a field effect transistor with a conventional spacer structure.
Figure 3A:
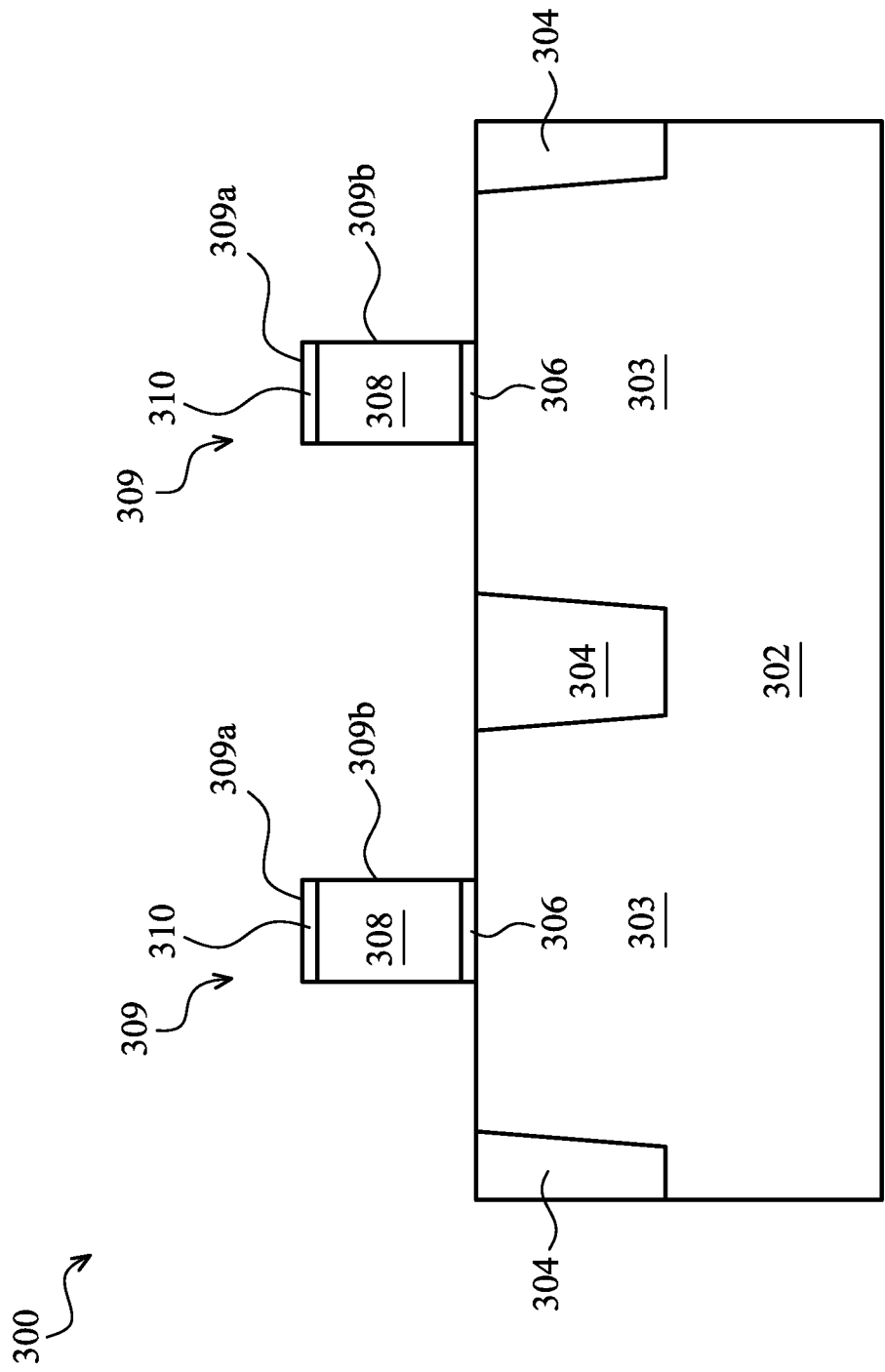
FIGS. 3A-H show schematic cross-sectional views of a spacer structure at various stages of fabrication according to an embodiment of the method of FIG. 2.
Figure 3B:
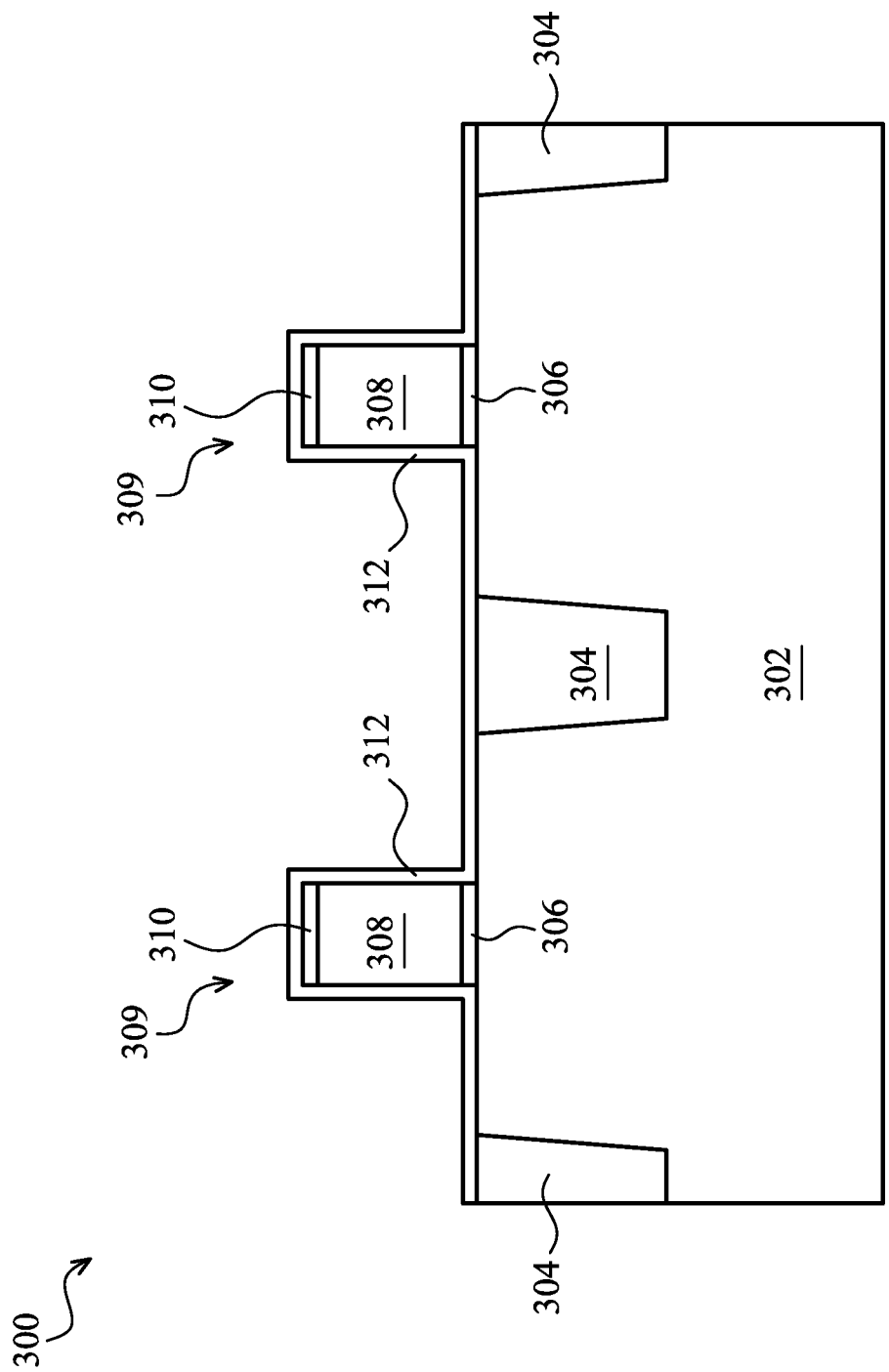
Figure 3C:
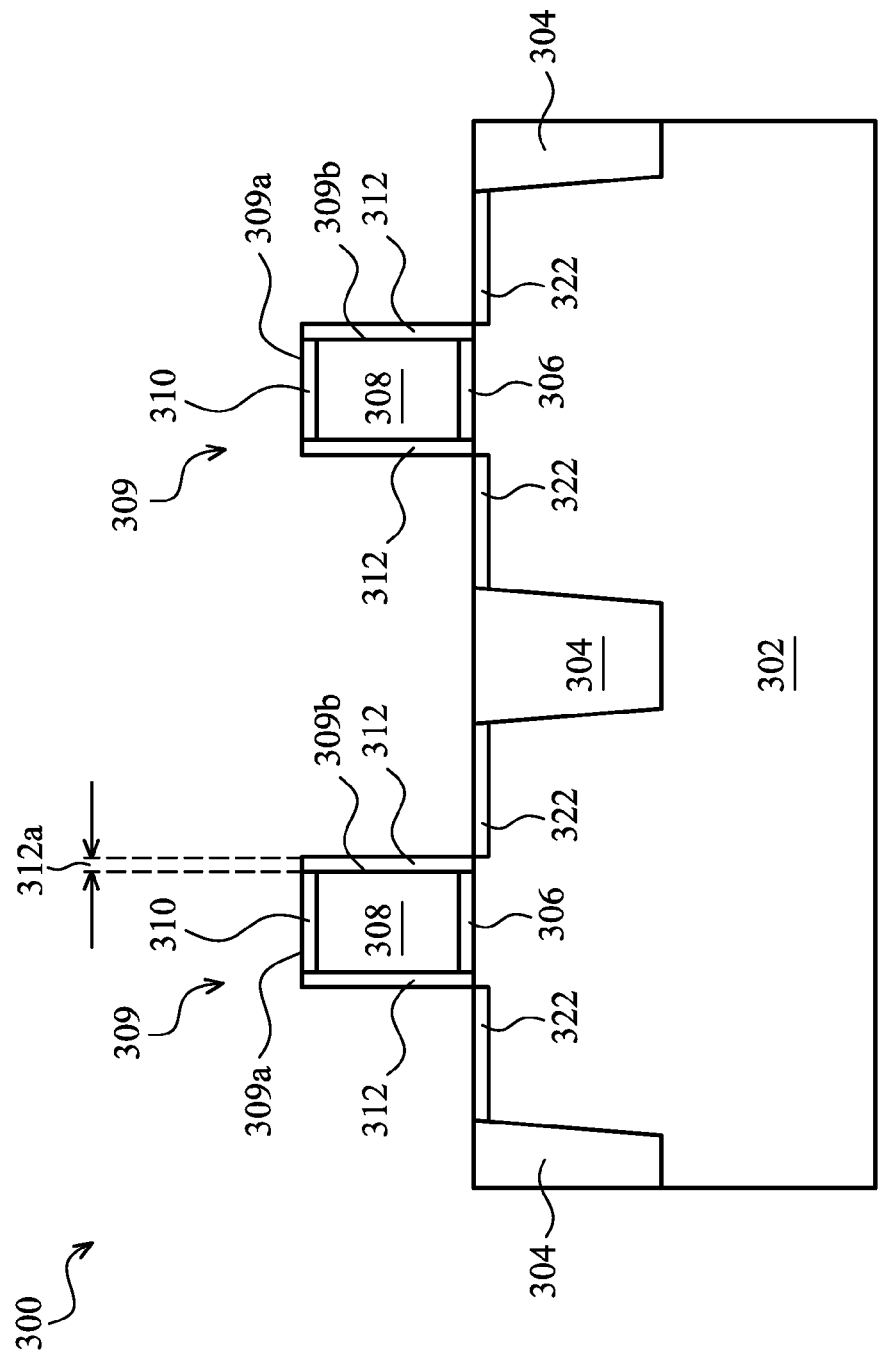
Figure 3D:
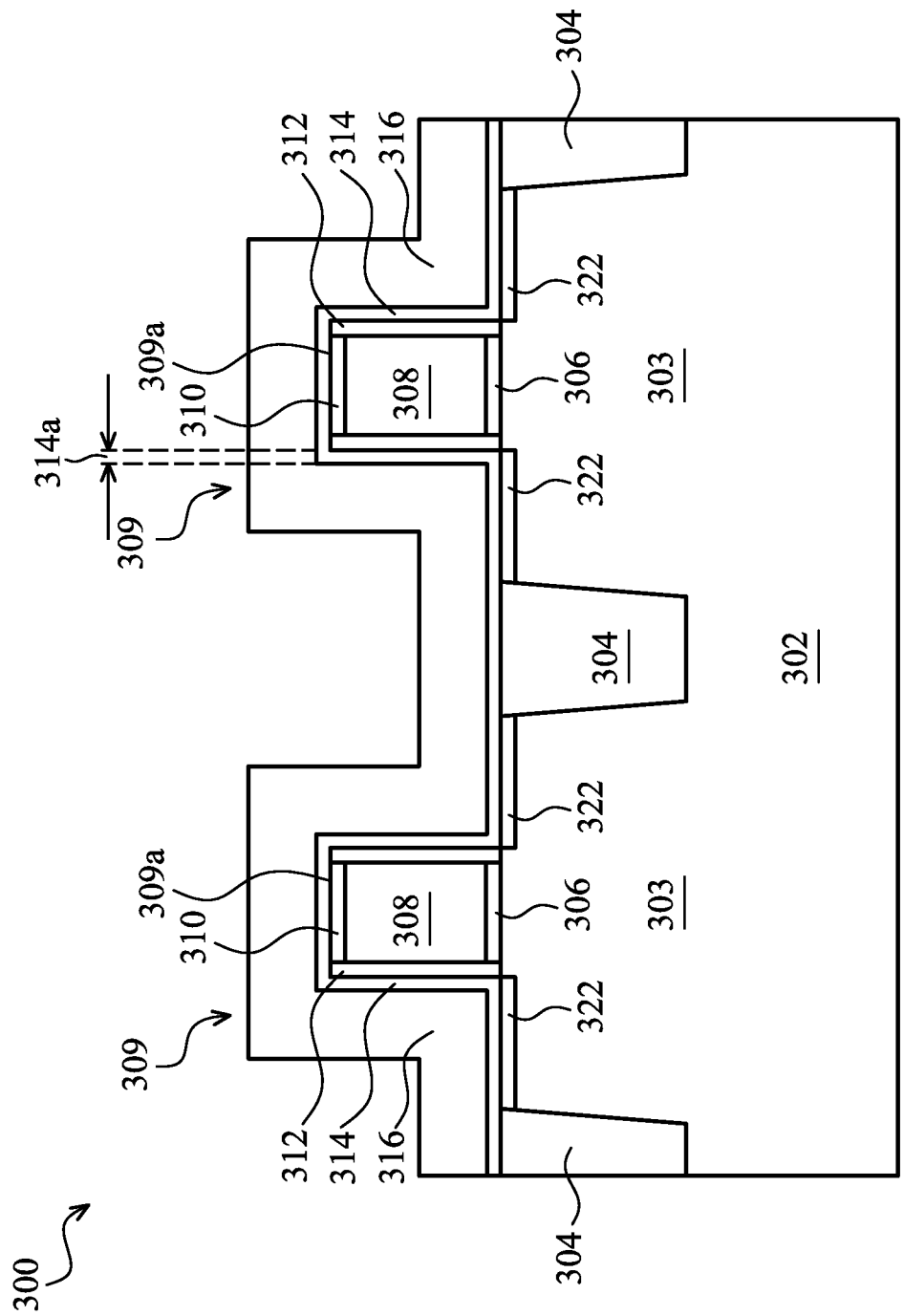
Figure 3E:
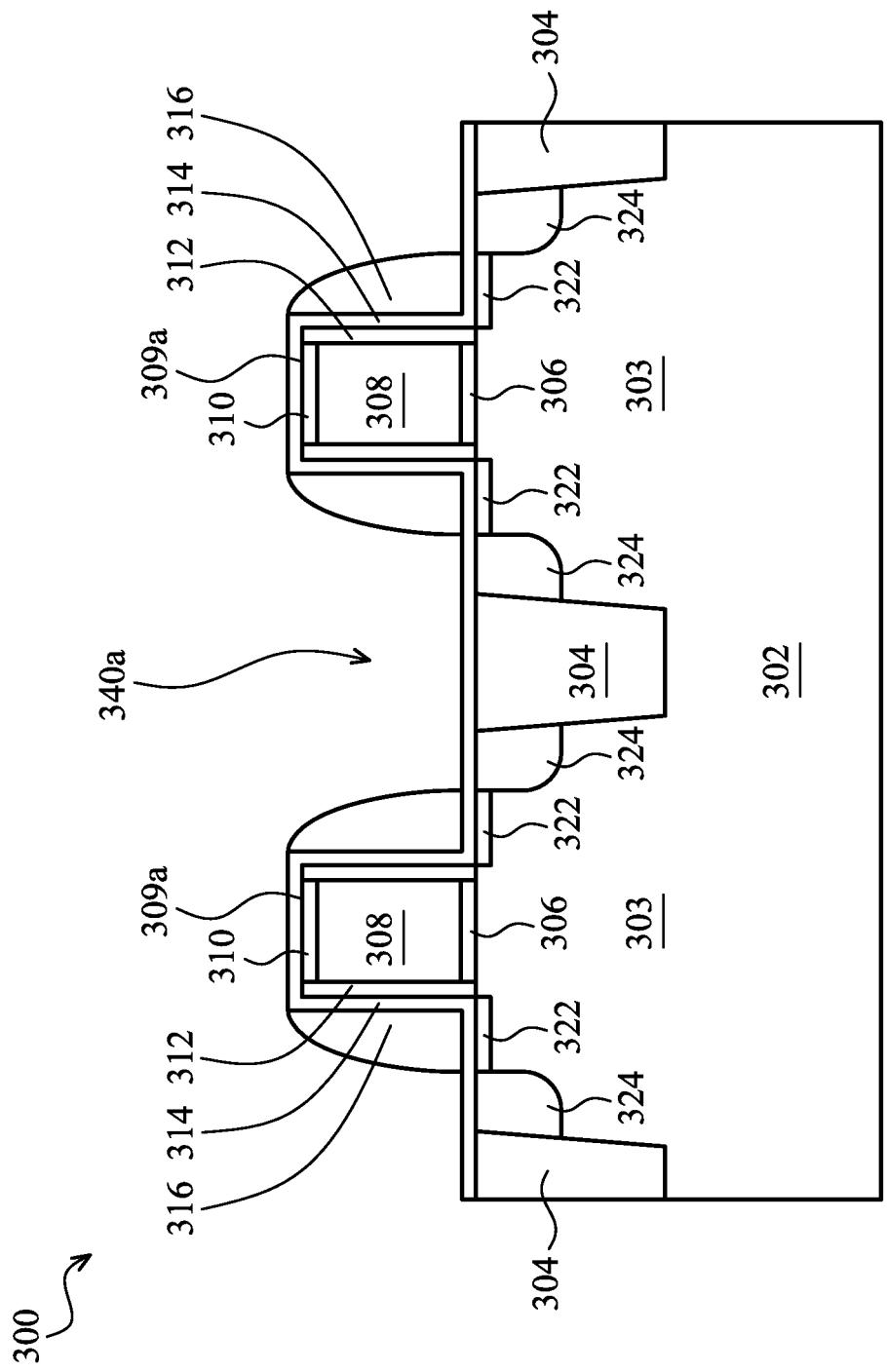
Figure 3F:
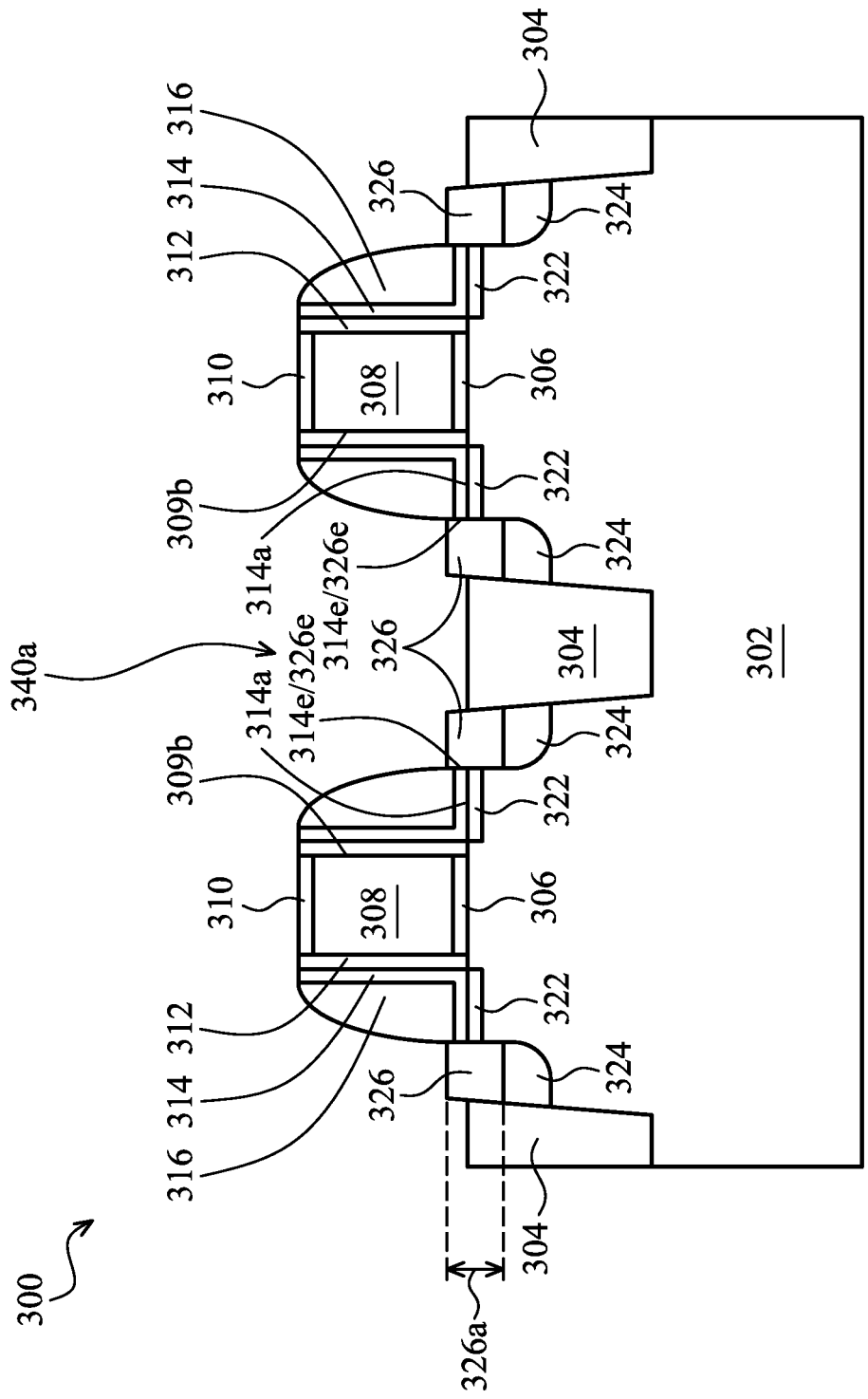
Figure 3G:
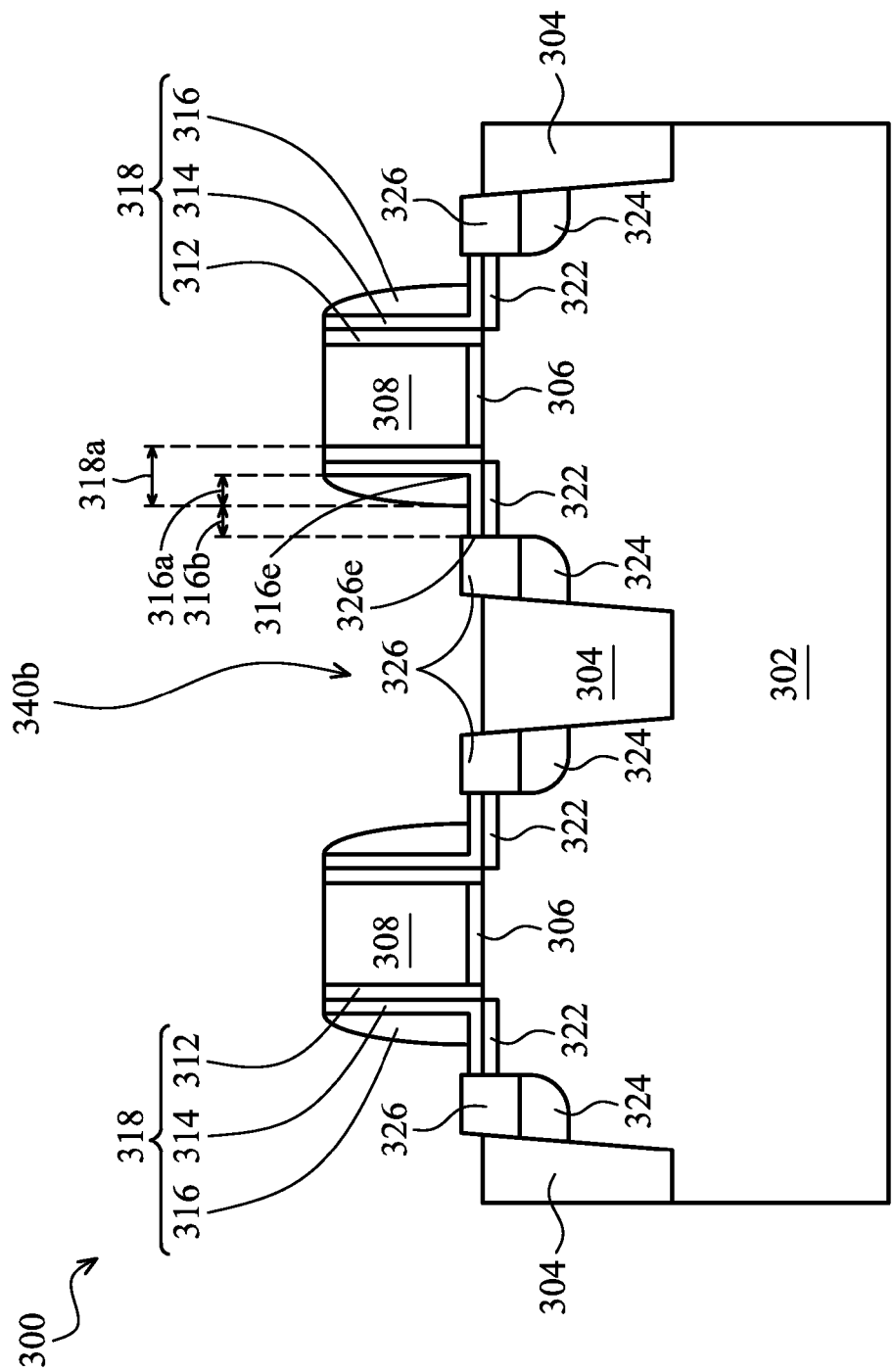
Figure 3H:
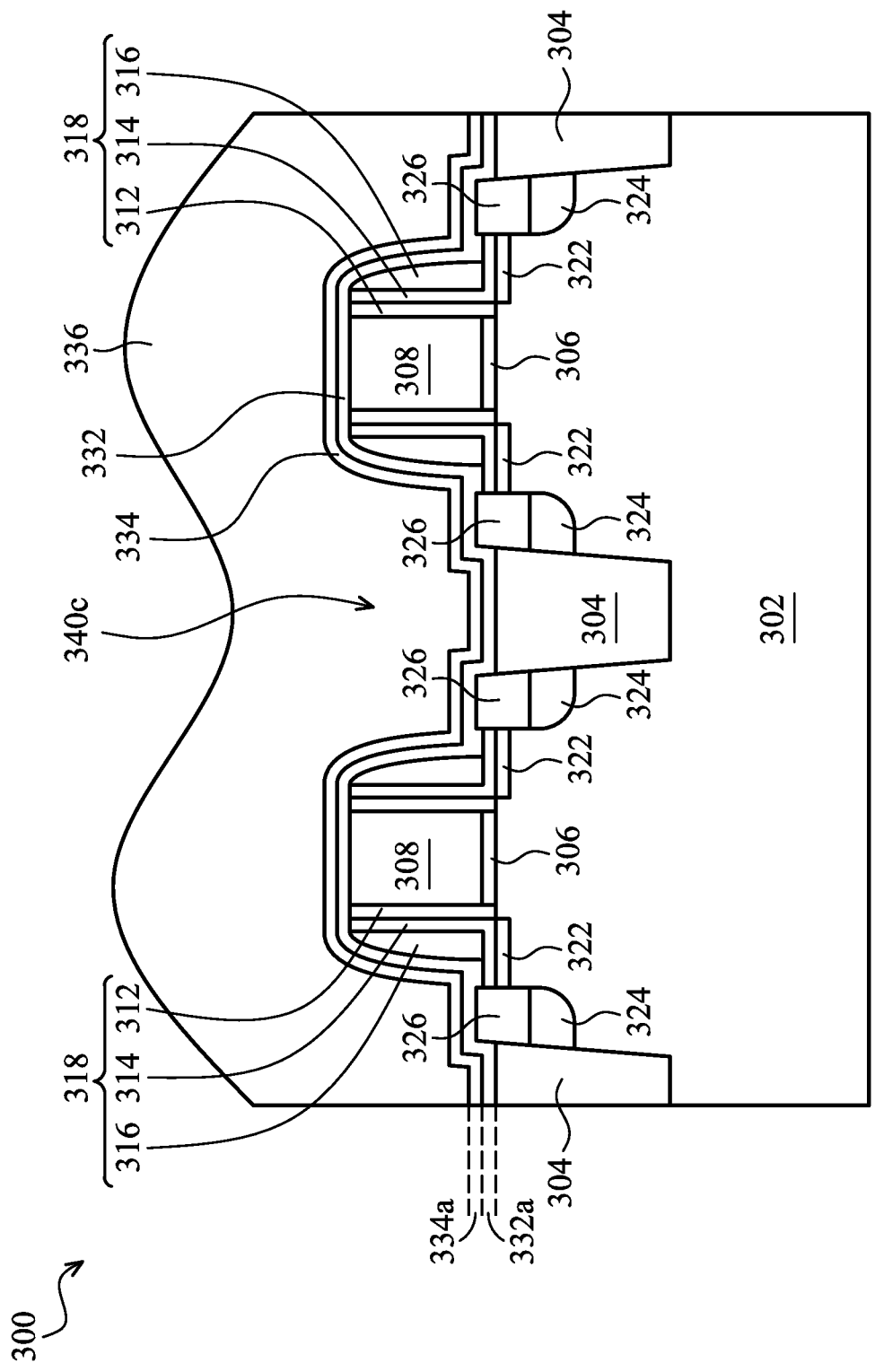

With reference to FIGS. 2 through 3H, a method 200 and a field effect transistor (FET) 300 are collectively described below. FIG. 2 is a flowchart illustrating a method 200 for fabricating a spacer structure 318 according to various aspects of the present disclosure. FIGS. 3A-H show schematic cross-sectional views of the spacer structure 318 at various stages of fabrication according to an embodiment of the method of FIG. 2. The method of FIG. 2 does not produce a completed FET. A completed FET may be fabricated using complementary metal-oxide-semiconductor (CMOS) technology processing. Accordingly, it is understood that additional processes may be provided before, during, and after the method 200 of FIG. 2, and that some other processes may only be briefly described herein. Also, FIGS. 2 through 3H are simplified for a better understanding of the concepts of the present disclosure. For example, although the figures illustrate the spacer structure 318 for the FET 300, it is understood the IC may comprise a number of other devices comprising resistors, capacitors, inductors, fuses, etc.

Referring to FIGS. 2 and 3A, the method 200 begins at step 202 wherein a dummy gate structure 309 comprising a top surface 309a and sidewall surfaces 309b over a substrate 302 is provided. The substrate 302 may comprise a silicon substrate. The substrate 302 may alternatively comprise silicon germanium, gallium arsenic, or other suitable semiconductor materials. The substrate 302 may further comprise other features such as various doped regions, a buried layer, and/or an epitaxy layer. Furthermore, the substrate 302 may be a semiconductor on insulator such as silicon on insulator (SOI). In other embodiments, the substrate 302 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 302 may comprise a multilayer silicon structure or a silicon substrate may include a multilayer compound semiconductor structure.

The substrate 302 may comprise an active region 303 and isolation regions 304. The active region 303 may include various doping configurations depending on design requirements as known in the art. In some embodiments, the active region 303 may be doped with p-type or n-type dopants. For example, the active region 303 may be doped with p-type dopants, such as boron or $BF_2$; n-type dopants, such as phosphorus or arsenic; and/or combinations thereof. The active region 303 may be configured for a N-type metal-oxide-semiconductor transistor (referred to as an NMOS) or for a P-type metal-oxide-semiconductor transistor (referred to as a PMOS).

Isolation regions 304 may be formed on the substrate 302 to isolate the various active regions 303. The isolation regions 304 may utilize isolation technology, such as local oxidation of silicon (LOCOS) or shallow trench isolation (STI), to define and electrically isolate the various active regions 303. In the present embodiment, the isolation region 304 comprises a STI. The isolation regions 304 may comprise silicon oxide, silicon nitride, silicon oxynitride, fluoride-doped silicate glass (FSG), a low-k dielectric material, other suitable materials, and/or combinations thereof. The isolation regions 304, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 3A, a dummy gate structure 309 over the substrate 302 may comprises a gate dielectric layer 306 and a dummy gate electrode layer 308. The gate dielectric layer 306 may be formed over the semiconductor substrate 302. In some embodiments, the gate dielectric layer 306 may comprise silicon oxide, silicon oxynitride, high-k dielectric layer or combination thereof. Examples of suitable high-k dielectric materials include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, and/or combinations thereof. The gate dielectric layer 30 may be grown by a thermal oxidation process, a chemical vapor deposition (CVD) process, an atomic layer deposition (ALD) process, and may have a thickness less than 2 nm.

The gate dielectric layer 306 may further comprise an interfacial layer (not shown) to minimize stress between the gate dielectric layer 306 and the substrate 302. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen.

A dummy gate electrode layer 308 may be formed over the gate dielectric layer 306. In some embodiments, the dummy gate electrode layer 308 may comprise a single layer or multilayer structure. In the present embodiment, the dummy gate electrode layer 308 may comprise poly-silicon. Further, the dummy gate electrode layer 308 may be doped poly-silicon with the uniform or gradient doping. The dummy gate electrode layer 308 may have any suitable thickness. In the present embodiment, the dummy gate electrode layer 308 has a thickness in the range of about 30 nm to about 60 nm. The dummy electrode layer 308 may be formed using a low-pressure chemical vapor deposition (LPCVD) process. In one embodiment, the LPCVD process can be carried out in a standard LPCVD furnace at a temperature of about 580° C. to 650° C. and at a pressure of about 200 mTorr to 1 Torr, using silane ($SiH_4$), disilane ($Si_2H_6$), trisilane ($Si_3H_8$) or dichlorosilane ($SiH_2Cl_2$) as the silicon source gas.

Additionally, the dummy gate structure 309 may further comprise a hard mask layer 310 over the dummy gate electrode 308 to protect the dummy gate electrode 308. The hard mask layer 310 may include silicon nitride. The hard mask layer 310 can be deposited by, for example, a CVD process, or a LPCVD process. The hard mask layer 310 may have a thickness of about 100 to 400 Å. The dummy gate structure 309 is formed using depositing blanket films of the gate dielectric layer 306 and dummy gate electrode layer 308. After the hard mask layer 310 is deposited, the hard mask layer 310 is patterned using a photo-sensitive layer (not shown). Then the dummy gate structure 309 is patterned through the hard mask layer 310 using a reactive ion etching (RIE) or a high density plasma (HDP) process, exposing a portion of the substrate 302.

Referring to FIGS. 2 and 3B, the method 200 continues with step 204 in which a first oxygen-sealing layer 312 is deposited on the dummy gate structure 309. The first oxygen-sealing layer 312 may comprise silicon nitride or carbon-doped silicon nitride. The first oxygen-sealing layer 312 may have any suitable thickness. In the present embodiment, the first oxygen-sealing layer 312 has a thickness in the range of about 40 to 60 angstroms. The first oxygen-sealing layer 312 may be deposited using a molecular layer deposition (MLD) process. The MLD process of the present disclosure is generally carried out under a pressure less than 10 mTorr and in the temperature range from about 350° C. to 500° C., such as about 450° C. In one embodiment, the silicon nitride is deposited on the dummy gate structure 309 by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, a carbon-doped silicon nitride is deposited on the dummy gate structure 309 by reacting a carbon source compound, a silicon source compound, and a nitrogen source. The carbon source compound may be an organic compound, such as a hydrocarbon compound, e.g., ethylene ($C_2H_6$).

Referring to FIGS. 2 and 3C, the method 200 continues with step 206 in which a portion of the first oxygen-sealing layer 312 on the top surface 309a of the dummy gate structure 309 is removed using a dry etching process (e.g., anisotropic etching), whereby the first oxygen-sealing layer 312 remains on the sidewall surfaces 309b of the dummy gate structure 309. It should be noted that the first oxygen-sealing layer 312 may seal the gate structure 309 from oxygen-containing structures and/or ambient oxygen in further process steps, so may prevent the transport of oxygen into the region beneath the gate structure 309. This prevention of oxygen transport beneath the gate structure 309 may at least partially prevent oxidation of the substrate 302, which could result in the formation of an undesired oxide, such as silicon oxide, beneath the gate structure 309. Such an undesired oxide could be of a thickness enough to degrade device performance if its formation is not prevented. The dry etching process may have a high selectivity such that the dry etching process does not etch into the surface of the substrate 302. For example, the dry etching process may be performed under a source power of about 150 to 220 W, and a pressure of about 10 to 45 mTorr, using BP, CH2F2, O2, He, and Ar as etching gases. In this way, the first oxygen-sealing layer 312 for the FET 300 is formed with almost no recess in the substrate surface. A maximum thickness 312a of the first oxygen-sealing layer 312 is in the range of about 40 to 60 angstroms.

Also shown in FIG. 3C, after formation of the first oxygen-sealing layer 312, lightly doped source and drain (LDD) regions 322 may be created in the substrate 302. This is accomplished via ion implantation of boron or phosphorous, at an energy between about 5 to 100 KeV, at a dose between about 1E11 to 1E 14 atoms/cm2.

Referring to FIGS. 2 and 3D, the method 200 continues with step 208 in which an oxygen-containing layer 314 may be deposited on the first oxygen-sealing layer 312 and the top surface 309a of the dummy gate structure 309. The oxygen-containing layer 314 may comprise silicon oxide or silicon oxynitride. The oxygen-containing layer 314 may have any suitable thickness. In the present embodiment, a maximum thickness 314a of the oxygen-containing layer 314 is in the range of about 20 to 30 angstroms. The oxygen-containing layer 314 can be deposited using a CVD or an ALD process. For example, the oxygen-containing layer 314 can be deposited under a pressure less than 10 mTorr and a temperature of about 350° C. to 500° C., such as about 450° C., using silane (SiH4) and N2O as reacting precursors.

Still referring to FIGS. 2 and 3D, the method 200 continues with step 210 in which a second oxygen-sealing layer 316 is deposited on the oxygen-containing layer 314. The second oxygen-sealing layer 316 may comprise silicon nitride or carbon-doped silicon nitride. The second oxygen-sealing layer 316 may have any suitable thickness. In the present embodiment, the second oxygen-sealing layer 316 has a thickness in the range of about 250 angstroms to about 300 angstroms. The second oxygen-sealing layer 316 can be deposited using a molecular layer deposition (MLD) process. The MLD process of the present disclosure is generally carried out under a pressure less than 10 mTorr and in the temperature range from about 350° C. to 500° C., such as about 450° C. In one embodiment, the silicon nitride is deposited on the oxygen-containing layer 314 by reacting a silicon source compound and a nitrogen source. The silicon source compound provides silicon to the deposited silicon nitride and may be silane (SiH4) or tetrathoxysilane (TEOS). The nitrogen source provides nitrogen to the deposited silicon nitride and may be ammonia (NH3) or nitrogen gas (N2). In another embodiment, a carbon-doped silicon nitride is deposited on the oxygen-containing layer 314 by reacting a carbon source compound, a silicon source compound, and a nitrogen source. The carbon source compound may be an organic compound, such as a hydrocarbon compound, e.g., ethylene (C2H6). It should be noted that the steps of depositing an oxygen-containing layer 314 and depositing a second oxygen-sealing layer 316 may be performed in a single reactor.

Referring to FIGS. 2 and 3E, the method 200 continues with step 212 in which a portion of the second oxygen-sealing layer 316 over the top surface 309a of the dummy gate structure 309 is removed using a dry etching process (e.g., anisotropic etching), whereby the second oxygen-sealing layer 316 adjoining the oxygen-containing layer 314 and extending over the portion of the oxygen-containing layer 314 over the substrate 302. The dry etching process may have a high selectivity such that the dry etching process may stop at the oxygen-containing layer 314 and form a high aspect ratio opening 340a. For example, the dry etching process may be performed under a source power of about 150 to 220 W, and a pressure of about 10 to 45 mTorr, using BP, CH2F2, O2, He, and Ar as etching gases.

Also shown in FIG. 3E, is the creation of the heavily doped source and drain (S/D) regions 324 needed for low resistance contact. This is achieved via ion implantation of boron or phosphorous, at an energy between about 5 to 150 KeV, at a dose between about 1E15 to 1E 16 atoms/cm2.

Referring to FIGS. 2 and 3F, the method 200 continues with step 214 in which silicide regions 326 are formed on the S/D regions 324 by a self-aligned silicide (salicide) process. For example, the self-aligned silicide (salicide) process may comprise 3 steps. First, a pre-clean of the exposed surfaces of the intermediate FET 300 structure in FIG. 3E may be needed to remove the oxygen-containing layer 314 and/or native oxide. This is accomplished via a buffered hydrofluoric acid (HF) treatment for a suitable time. It should be noted that the remaining oxygen-containing layer 314 adjoining the first oxygen-sealing layer 312 on the sidewall 309b of the gate structure 309 may further comprise a portion 314a extending over the substrate 302. Next, a metal material may be deposited via sputtering to the substrate surface at a temperature between 500° C. to 900° C., causing a reaction between the underlying silicon and metal material to form silicide regions 326. And then, the un-reacted metal material may be etched away. The silicide regions 326 may comprise a material selected from titanium silicide, cobalt silicide, nickel silicide, platinum silicide, erbium silicide, and palladium silicide.

It should be noted that the hard mask layer 310 and the second oxygen-sealing layer 316 may protect the dummy poly-silicon layer 308 from the salicide process. A maximum thickness 326a of the silicide region 326 is in the range of about 300 to 500 angstroms. The silicide region 326 on each side of the gate structure 309 comprises an inner edge 326e closest to the gate structure 309. The inner edge 326e is substantially aligned to an outer edge 314e of the oxygen-containing layer 314.

Referring to FIGS. 2 and 3G, the method 200 continues with step 216 in which the second oxygen-sealing layer 316 adjoining the oxygen-containing layer 314 and extending over the portion of the oxygen-containing layer 314 over the substrate 302 is thinned using a wet etching process. Further, the hard mask layer 310 may be simultaneously removed during the wet etching process. The wet etching process may have a high selectivity such that the wet etching process may stop at the STI 304, the oxygen-containing layer 314, the dummy gate electrode 308, and the silicide region 326. For example, the high selectivity may be accomplished via a phosphoric acid (H3PO4) treatment for a suitable time. The wet etching process may form an opening 340b. Aspect ratio of the opening 340b is lower than that of the opening 340a in FIG. 3E. The high aspect ratio of opening 340a in FIG. 3E may cause voids to form in subsequently formed layers as there is not enough space between the second oxygen-sealing layer 316 to allow the subsequently formed layer (such as an ILD layer) to fill the small region between the second oxygen-sealing layer 316. On the other hand, the lower aspect ratio of the opening 340b may impede void formation in the ILD layer (described below with respect to FIG. 3H) thereby decreasing the likelihood of device instability and/or device failure. Alternatively, if the hard mask layer 310 is not simultaneously removed during the wet etching process, the hard mask layer 310 may then be removed using a dry etching process comprising F or Cl based etchants.

A maximum thickness 316a of the second oxygen-sealing layer 316 is in the range of about 100 to 130 angstroms. Further, The first oxygen-sealing layer 312, oxygen-containing layer 314, and second oxygen-sealing layer 316 are hereinafter referred to as a spacer structure 318. A combined thickness 318a of the first oxygen-sealing layer 312, oxygen-containing layer 314, and second oxygen-sealing layer 316 is in the range of about 160 to 220 angstroms. Additionally, the thinned second oxygen-sealing layer 316 comprises an outer edge 316e offset from the inner edge 326e of the silicide region 326 by a distance 316b. The outer edge 316e of the second oxygen-sealing layer 316 is offset 316b from the inner edge 326e of the silicide region 326 by about 120 to 200 angstroms.

Referring to FIG. 3H, a liner oxide 332, a CESL 334, and an ILD layer 336 may be sequentially formed over the structure of FIG. 3G. The liner oxide 332 may be formed of silicon oxide deposited by a CVD process. A thickness 332a of the liner oxide 332 is in the range of about 30 to 50 angstroms. The CESL 334, for example a silicon nitride or silicon oxynitride layer, is formed over the liner oxide 332 to form a low aspect ratio opening 340c. The CESL 334 can be deposited by, for example, a CVD process, or a LPCVD process. A thickness 334a of the CESL 334 is in the range of about 180 to 220 angstroms.

Due to the low aspect ratio of the opening 340c, the ILD layer 336 is then formed over the CESL 334 to a sufficient thickness to form a void-free dielectric layer within the opening 340c. For example, the ILD layer 336 is preferably deposited to a thickness of 3000 to 4500 Å. In one embodiment, the ILD layer 336 may be formed using a CVD process, such as high density plasma (HDP) CVD process or sub-atmospheric CVD (SACVD) process. For example, the ILD layer 336 comprises a HDP oxide layer. The ILD layer 336 can be deposited under a low frequency power less than 5000 W, a high frequency power less than 3500 W, a pressure less than 10 mTorr and a temperature of about 500 to 1000° C., using silane and oxygen as reacting precursors. For another example, the ILD layer 336 comprises a sub-atmospheric undoped-silicon glass (SAUSG) layer. The ILD layer 336 can be deposited under a pressure of about 500 to 700 torr and a temperature of about 500 to 600° C., using tetraethoxysilane (TEOS) and $O_3$ as reacting precursors.

Figure 4:
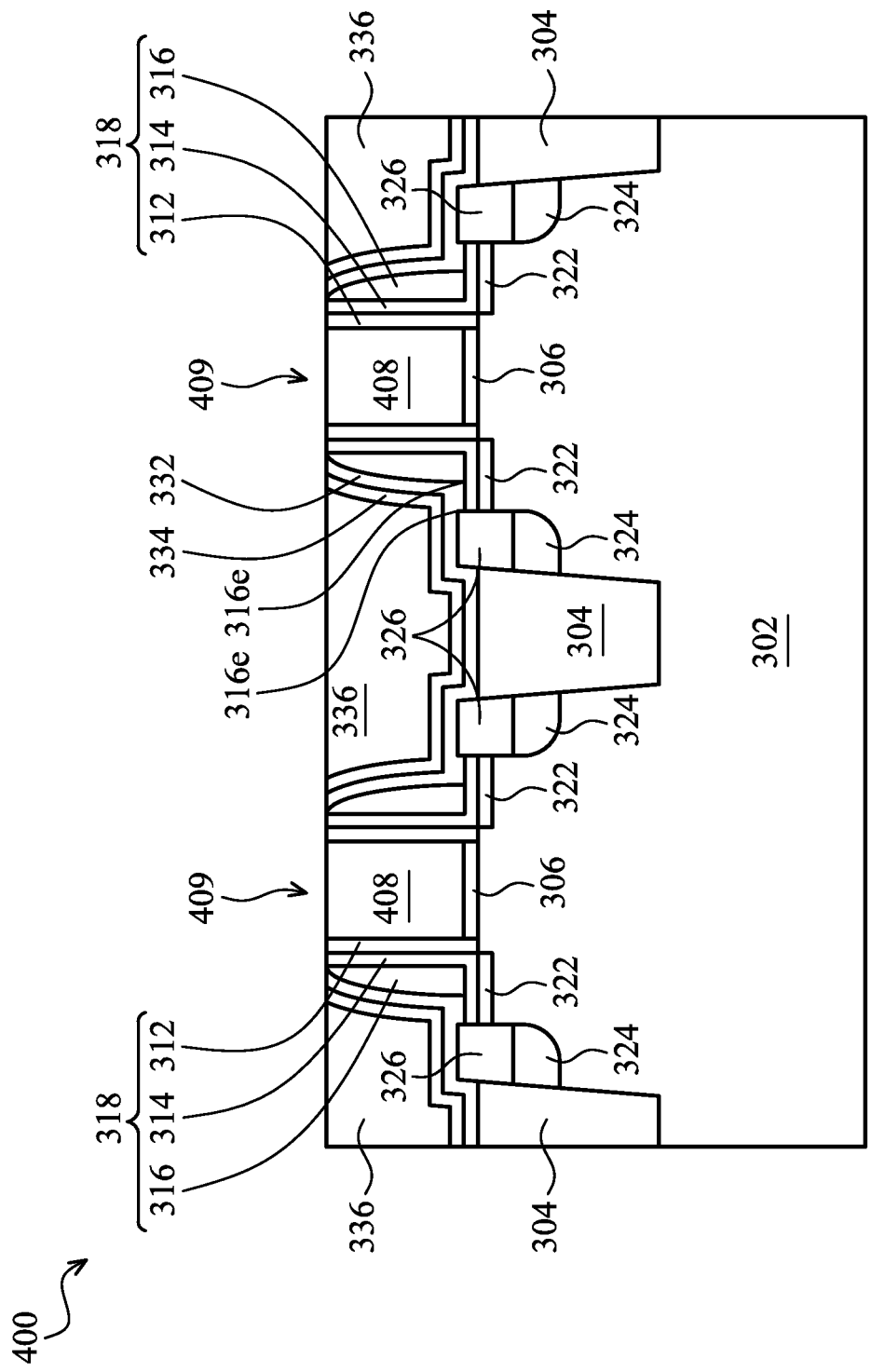
FIG. 4 is a cross-sectional view of a field effect transistor fabricated using the steps shown in FIG. 3A-H.

FIG. 4 illustrates a cross-sectional view of a completed FET 400 fabricated using a method comprising the steps shown in FIG. 3A-H. Similar features in FIGS. 3 and 4 are numbered the same for the sake of simplicity and clarity. FIG. 3H shows the result of a gate last process up to the step of depositing the ILD 336 layer. The CMOS processing steps required to complete the FET 400 structure comprise a chemical mechanical polishing (CMP) on the ILD 336 layer to expose the dummy gate structure 309. The dummy gate electrode 308 may then be removed from the dummy gate structure 309, thereby forming a trench. A metal layer may be formed to fill in the trench. The metal layer may include any metal material suitable for forming a metal gate electrode 408 or portion thereof, including barriers, work function layers, liner layers, interface layers, seed layers, adhesion layers, barrier layers, etc. For example, the metal layer may optionally include suitable metals, such as TiN, WN, TaN, or Ru that properly perform in the PMOS device. Alternatively, the metal layer may optionally include suitable metals, such as Ti, Ag, Al, TiAl, TiAlN, TaC, TaCN, TaSiN, Mn, or Zr that properly perform in the NMOS device. Another CMP is performed on the metal layer to form the metal gate electrode 408 of the field effect transistor 400. The metal gate electrode 408 and gate dielectric layer 306 are hereinafter referred to as a gate structure 409.

Therefore, the field effect transistor 400 comprises a gate structure 409 comprising a sidewall overlying the substrate 302; the silicide region 326 in the substrate 302 on one side of the gate structure 409 having the inner edge 326e closest to the gate structure 409; the first oxygen-sealing layer 312 adjoining the sidewall of the gate structure 409; an oxygen-containing layer 314 adjoining the first oxygen-sealing layer 312 on the sidewall and further comprising a portion extending over the substrate 302; and the second oxygen-sealing layer 316 adjoining the oxygen-containing layer 314 and extending over the portion of the oxygen-containing layer 314 over the substrate 302, wherein the outer edge 316e of the second oxygen-sealing layer 316 is offset from the inner edge 326e of the silicide region 326. Then, subsequent processes, including interconnect processing, must be performed after forming the field effect transistor 400 to complete the IC fabrication.

While the embodiments of this disclosure have been described by way of example and in terms of the preferred embodiments, it is to be understood that this disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The embodiments of this disclosure can be used to form or fabricate a spacer structure for a field effect transistor. In this way, a void-free ILD layer for a field effect transistor may be formed

What is claimed is:

1. A field effect transistor comprising:
   a substrate;
   a gate structure comprising a sidewall overlying the substrate;
   a silicide region in the substrate on one side of the gate structure having an inner edge closest to the gate structure;
   a first oxygen-sealing layer adjoining the sidewall of the gate structure;
   an oxygen-containing layer adjoining the first oxygen-sealing layer on the sidewall and further comprising a portion extending over the substrate, wherein an outer edge of the oxygen-containing layer is in contact with the inner edge of the silicide region;
   a second oxygen-sealing layer adjoining the oxygen-containing layer and extending over the portion of the oxygen-containing layer over the substrate, wherein an outer edge of the second oxygen-sealing layer is offset from the inner edge of the silicide region; and
   a liner oxide adjoining the second oxygen-sealing layer and extending over the silicide region, wherein a top portion furthest from the substrate of the liner oxide and a top portion furthest from the substrate of the second oxygen-sealing layer are substantially co-planar.

2. The field effect transistor of claim 1, wherein the first oxygen-sealing layer comprises silicon nitride or carbon-doped silicon nitride.

3. The field effect transistor of claim 1, wherein a thickness of the first oxygen-sealing layer is in the range of about 40 to 60 angstroms.

4. The field effect transistor of claim 1, wherein the oxygen-containing layer comprises silicon oxide or silicon oxynitride.

5. The field effect transistor of claim 1, wherein a thickness of the oxygen-containing layer is in the range of about 20 to 30 angstroms.

6. The field effect transistor of claim 1, wherein the second oxygen-sealing layer comprises silicon nitride or carbon-doped silicon nitride.

7. The field effect transistor of claim 1, wherein a thickness of the second oxygen-sealing layer is in the range of about 100 to 130 angstroms.

8. The field effect transistor of claim 1, wherein a combined thickness of the first oxygen-sealing layer, oxygen-containing layer, and second oxygen-sealing layer is in the range of about 160 to 220 angstroms.

9. The field effect transistor of claim 1, wherein the silicide region comprises a material selected from titanium silicide, cobalt silicide, nickel silicide, platinum silicide, erbium silicide, and palladium silicide.

10. The field effect transistor of claim 1, wherein a thickness of the silicide region is in the range of about 300 to 500 angstroms.

11. The field effect transistor of claim 1, wherein the outer edge of the second oxygen-sealing layer is offset from the inner edge of the silicide region by about 120 to 200 angstroms.

12. The field effect transistor of claim 1, wherein a thickness of the liner oxide is in the range of about 30 to 50 angstroms.

13. The field effect transistor of claim 1 further comprising a contact etch stop layer adjoining the liner oxide.

14. The field effect transistor of claim 13, wherein a thickness of the contact etch stop layer is in the range of about 180 to 220 angstroms.

15. A semiconductor device comprising:
a first field effect transistor;
a second field effect transistor;
an isolation region between the first field effect transistor and the second field effect transistor, wherein
each of the first field effect transistor and the second field effect transistor comprises:
a substrate;
a gate structure comprising a sidewall overlying the substrate;
a silicide region in the substrate on one side of the gate structure having an inner edge closest to the gate structure;
a first oxygen-sealing layer adjoining the sidewall of the gate structure;
an oxygen-containing layer adjoining the first oxygen-sealing layer on the sidewall and further comprising a portion extending over the substrate, wherein an outer edge of the oxygen-containing layer is in contact with the inner edge of the silicide region;
a second oxygen-sealing layer adjoining the oxygen-containing layer and extending over the portion of the oxygen-containing layer over the substrate, wherein an outer edge of the second oxygen-sealing layer is offset from the inner edge of the silicide region; and
a liner oxide adjoining the second oxygen-sealing layer and extending over the silicide region, wherein a top portion furthest from the substrate of the liner oxide and a top portion furthest from the substrate of the second oxygen-sealing layer are substantially co-planar.

16. The semiconductor device of claim 15, wherein the first oxygen-sealing layer of each of the first and second field effect transistors comprises silicon nitride or carbon-doped silicon nitride, and
the second oxygen-sealing layer of each of the first and second field effect transistors comprises silicon nitride or carbon-doped silicon nitride.

17. The semiconductor device of claim 15, wherein a thickness of the first oxygen-sealing layer of each of the first and second field effect transistors is in the range of about 40 to 60 angstroms, and
a thickness of the second oxygen-sealing layer of each of the first and second field effect transistors is in the range of about 100 to 130 angstroms.

18. The semiconductor device of claim 15, wherein the oxygen-containing layer of each of the first and second field effect transistors comprises silicon oxide or silicon oxy-nitride.

19. The semiconductor device of claim 15, wherein a thickness of the oxygen-containing layer of each of the first and second field effect transistors is in the range of about 20 to 30 angstroms.

20. The semiconductor device of claim 15, wherein a combined thickness of the first oxygen-sealing layer, oxygen-containing layer, and second oxygen-sealing layer of each of the first and second field effect transistors is in the range of about 160 to 220 angstroms.

21. The semiconductor device of claim 15, wherein the outer edge of the second oxygen-sealing layer of each of the first and second field effect transistors is offset from the inner edge of the silicide region of each of the first and second field effect transistors by about 120 to 200 angstroms.

22. The semiconductor device of claim 15, wherein each of the first and second field effect transistors further comprises:
a contact etch stop layer adjoining the liner oxide.

23. The semiconductor device of claim 22, wherein the liner oxide of the first field effect transistor is connected to the liner oxide of the second field effect transistor, and
the contact etch stop layer of the first field effect transistor is connected to the contact etch stop layer of the second field effect transistor.

24. The semiconductor device of claim 15, wherein the outer edge of the second oxygen-sealing layer of each of the first and second field effect transistors is offset from the inner edge of the silicide region of each of the first and second field effect transistors by about 120 to 200 angstroms.

25. The field effect transistor of claim 1, wherein the silicide region is a salicide region.

* * * * *